US006973401B2

(12) United States Patent
Eibl et al.

(10) Patent No.: US 6,973,401 B2
(45) Date of Patent: Dec. 6, 2005

(54) MEASURING DEVICE AND METHOD FOR DETERMINING A CHARACTERISTIC CURVE OF A HIGH FREQUENCY UNIT

(75) Inventors: Joachim Eibl, Munich (DE); Jochen Pliquett, Gaggenau (DE); Hagen Eckert, Mering (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 123 days.

(21) Appl. No.: 10/694,539

(22) Filed: Oct. 27, 2003

(65) Prior Publication Data

US 2004/0257060 A1    Dec. 23, 2004

(30) Foreign Application Priority Data

Nov. 8, 2002    (DE) ................. 102 52 099

(51) Int. Cl.⁷ .......................................... G06F 19/00
(52) U.S. Cl. ................................ 702/106; 702/85
(58) Field of Search ................. 324/76.11, 76.12, 324/76.13, 76.18, 76.19, 76.2, 76.21, 76.22, 324/76.28, 76.74, 76.77, 76.78; 330/2; 455/130; 702/57, 66, 69, 71, 72, 85, 106, 127, 182, 702/183, 189

(56) References Cited

U.S. PATENT DOCUMENTS

| | | | | |
|---|---|---|---|---|
| 4,801,899 A | * | 1/1989 | Ashida ..................... 332/103 |
| 5,105,446 A | * | 4/1992 | Ravoalavoson et al. .... 375/296 |
| 5,315,618 A | * | 5/1994 | Yoshida ..................... 375/340 |
| 5,799,038 A | * | 8/1998 | Nowara et al. ............. 375/224 |
| 5,854,570 A | * | 12/1998 | Schmidt ..................... 329/304 |
| 6,052,571 A | * | 4/2000 | Mishima et al. ............. 455/318 |
| 6,104,983 A | * | 8/2000 | Nakada ..................... 702/66 |
| 6,232,760 B1 | * | 5/2001 | Eckert ..................... 324/76.19 |
| 6,445,713 B1 | * | 9/2002 | Nowara ..................... 370/441 |
| 6,480,236 B1 | * | 11/2002 | Limberg ..................... 348/555 |
| 6,489,846 B2 | * | 12/2002 | Hatsugai ..................... 330/149 |
| 6,658,065 B1 | * | 12/2003 | Della Torre et al. ........ 375/296 |
| 6,693,920 B2 | * | 2/2004 | Montojo et al. ............. 370/503 |
| 6,700,453 B2 | * | 3/2004 | Heiskala et al. ............. 332/103 |

FOREIGN PATENT DOCUMENTS

| | | |
|---|---|---|
| DE | 1 019 707 B | 11/1957 |
| DE | 695 05 540 T2 | 10/1998 |
| DE | 100 22 853 A1 | 9/2001 |

\* cited by examiner

*Primary Examiner*—Bryan Bui
*Assistant Examiner*—Douglas N. Washburn
(74) *Attorney, Agent, or Firm*—Caesar, Rivise, Bernstein, Cohen & Pokotilow, Ltd.

(57) ABSTRACT

The invention relates to a method and a measuring device for determining a characteristic curve of a high frequency transmitter for transmitting a high frequency signal modulated with a modulation signal. A high frequency signal transmitted by the high frequency transmitter is received by a receiving device (16) and samples of a complex value, real baseband signal (MEAS) are generated therefrom. By demodulation of the samples of the real baseband signal (MEAS), a modulation symbol sequence (SYM) is obtained, from which an ideal baseband signal (REF) is simulated as reference signal. The real baseband signal (MEAS) is corrected, a corrected, real baseband signal (MEAS') is generated and the deviations of the samples of the corrected, real baseband signal (MEAS') from the samples of the ideal baseband signal (REF) are evaluated.

26 Claims, 10 Drawing Sheets

MEASURING DEVICE AND METHOD FOR DETERMINING A CHARACTERISTIC CURVE OF A HIGH FREQUENCY UNIT

BACKGROUND OF THE INVENTION

The invention relates to a method and a measuring device for determining a characteristic curve of a high frequency unit which outputs a high frequency signal modulated with a modulation signal.

A method for determining parameters of an n gate, in particular characteristic curves of an amplifier, is known for example from DE 100 22 853 A1. In order to determine the characteristic curve of the amplifier, the input signal and the output signal of the amplifier is supplied to the measuring device. In order to be able to dispense with a phase-coherent demodulation and the synchronization demodulator, which is necessary therefor, the supply of the input and of the output signal to the measuring device is effected with an unknown time delay, the missing time information being determined by a cross-correlation. In order to implement such a cross-correlation, advance knowledge of the input signal is however necessary.

The requirement for the known input signal has the disadvantage in practice that the signal supplied to the amplifier must be measured and supplied to the measuring device. This means that a connection between the measuring device and the input side of the amplifier must be generated in order to implement the measurement.

The object underlying the invention is to produce a method and a measuring device for determining a characteristic curve of a high frequency unit which outputs a high frequency signal modulated with a modulation signal, in which the determination of the characteristic curve is possible during operation without producing an additional connection between the input of the high frequency unit and the measuring device for transmitting the information content of the high frequency signal.

SUMMARY OF THE INVENTION

According to the invention, in order to determine a characteristic curve of a high frequency unit, in particular of an amplifier, only the high frequency signal transmitted by the high frequency unit is required. The high frequency signal transmitted by the high frequency unit is received by a receiving unit and a complex value, real baseband signal is generated therefrom, for example by sampling the intermediate frequency and subsequently by digital mixing and filtering or by analogue mixing and subsequent sampling. By demodulation of the samples, a modulation symbol sequence corresponding to the real baseband signal is determined, from which an ideal baseband signal is simulated in turn as reference signal. With the knowledge of this simulated ideal baseband signal, a corrected, real baseband signal is generated from the real baseband signal, in that the samples of the real baseband signal are corrected taking into account their deviations from the ideal baseband signal. By correcting the samples of the real baseband signal, linear errors are eliminated from the real baseband signal. In contrast, the non-linear distortions, which are relevant for the course of the characteristic curve of the amplifier, are maintained. From the samples of the corrected, real baseband signal and from the samples of the ideal baseband signal, the characteristic curve of the high frequency unit to be measured can then be determined.

Determination of the characteristic curve of the high frequency unit is effected in the method according to the invention or in the measuring device according to the invention and with the knowledge of the modulation method (PSK, QAM, symbol rate, modulation parameters . . . ) from the information, which can be deduced from the signal transmitted by the high frequency unit. Measurement of a signal sequence at the input or knowledge of a specific signal sequence, which is used, is hence superfluous. The knowledge of a sequence of samples of the ideal baseband signal as reference signal, which is necessary for determining a characteristic curve, is achieved according to the invention in that the ideal baseband signal is simulated from the received high frequency signal, which baseband signal underlies the signal transmitted by the high frequency unit. This determination of the ideal baseband signal as reference signal for the further evaluation is not subject to any restriction so that measurement, e.g. of an amplifier, is possible with the method according to the invention even during regular operation of the amplifier.

It is advantageous in particular that the samples are combined in a plurality of groups. For each of these groups, a representation value pair is determined which is used as representative of the number of samples contained in the group in order to approximate the course of a characteristic curve of the amplifier to the representation value pairs as support points of the characteristic curve.

It is thereby particularly advantageous to combine the samples in a plurality of groups such that approximately the same number of samples is contained in each of the formed groups and that the formed representation value pair is hence formed on the basis of approximately the same number of samples. The quality of the individual representation values barely varies therefore from one to the other, as a result of which confidence in the determined characteristic curve increases.

In addition, it is particularly advantageous that, in order to determine the representation value pair of the respective group, only interval sums are calculated. Involved sorting, in which the computing complexity for n values increases by $n*\log(n)$, can hence be dispensed with. In order to form the interval sums, firstly intervals are formed which divide the observed amplitude or level range in portions of the same width. In order to form the interval sums, the respective values of the samples falling within a corresponding interval are added up. When forming groups, the thus generated interval sums respectively can then be used for further calculation, as a result of which the required computing complexity is significantly reduced.

In order to increase the precision of the characteristic curve in a wide level range, it is advantageous in addition to implement a plurality of measurements during various swings of the high frequency unit, groups being formed for each of the implemented measurements, for which groups the associated representation value pairs are determined. In order to determine the characteristic curve over the entire level or power range, the representation value pairs of several are used in the case of various swings in order to determine the characteristic curve. The quality can be improved not only by increasing the number of values in one measurement but also in that the results are collected from a plurality of measurements (bursts) (averaging).

BRIEF DESCRIPTION OF SEVERAL VIEWS OF THE DRAWINGS

Preferred embodiments of the method according to the invention and of the measuring device are explained in more detail in the subsequent description with reference to the drawing. There are shown:

FIG. 1a, b the exemplary course of an amplitude characteristic curve and representation of the distortions in a constellation diagram, FIG. 2a, b the exemplary course of a phase characteristic curve and representation of the distortions in a constellation diagram, FIG. 3 the representation of the sum of the amplitude and phase distortions in a constellation diagram, FIG. 4 a block diagram of a first embodiment of the measuring device according to the invention, FIG. 5a, b an exemplary representation of samples of a corrected, real baseband signal in a constellation diagram for amplitude distortions or for phase distortions, FIG. 6 a representation of the sum of the amplitude and phase distortions of a corrected, real baseband signal in a constellation diagram, FIG. 7 a schematic representation of a plurality of intervals of a level range to be measured, FIG. 8 a schematic representation of intervals of FIG. 7, combined into groups, FIG. 9 a schematic representation of the determination of the representation values of the groups, FIG. 10a, b the exemplary course of an amplitude or phase characteristic curve determined from representation value pairs, FIG. 11 a block diagram of a second embodiment of the measuring device according to the invention, FIG. 12 a block diagram of a third embodiment of the measuring device according to the invention, FIG. 13a, b a schematic representation for the implementation of a plurality of measurements for determining a characteristic curve, FIG. 14 the implementation of a plurality of measurements for determining the power and frequency dependency of non-linear distortions, and FIG. 15 an example of an output of an amplitude characteristic curve of a measuring device according to the invention.

DETAILED DESCRIPTION OF THE PREFERRED EMBODIMENTS

Figure 1A:
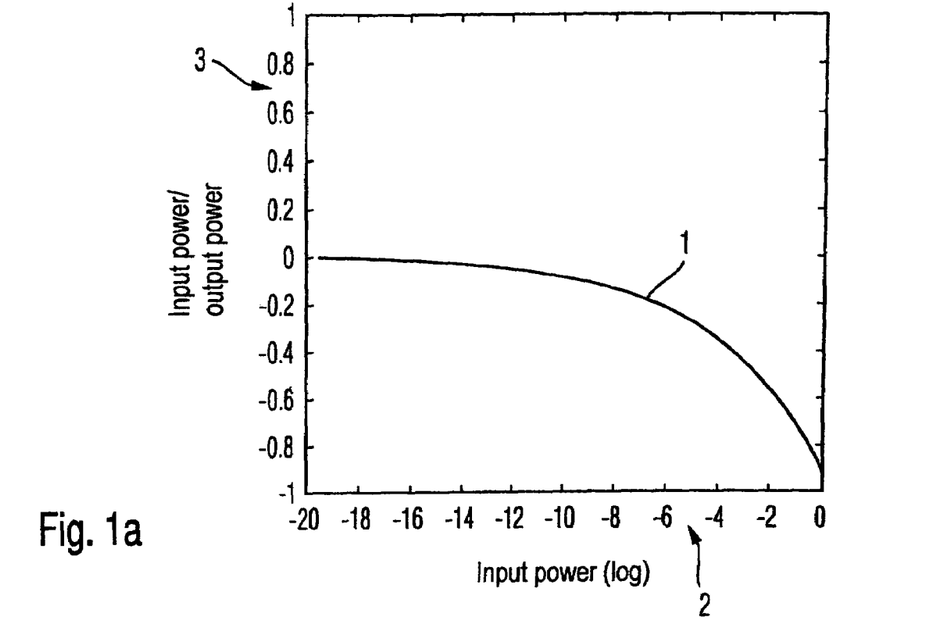

In FIG. 1a, a course of an amplitude characteristic curve 1 of an amplifier of a high frequency transmitter for transmitting a high frequency signal, which is modulated, with a modulation signal is shown by way of example. On the abscissa 2, the input power of the amplifier is thereby plotted on a logarithmic scale. On the ordinate 3, the deviation from the ideal power value is likewise indicated on a logarithmic scale as a ratio of the input power to the output power of the amplifier.

Figure 1B:
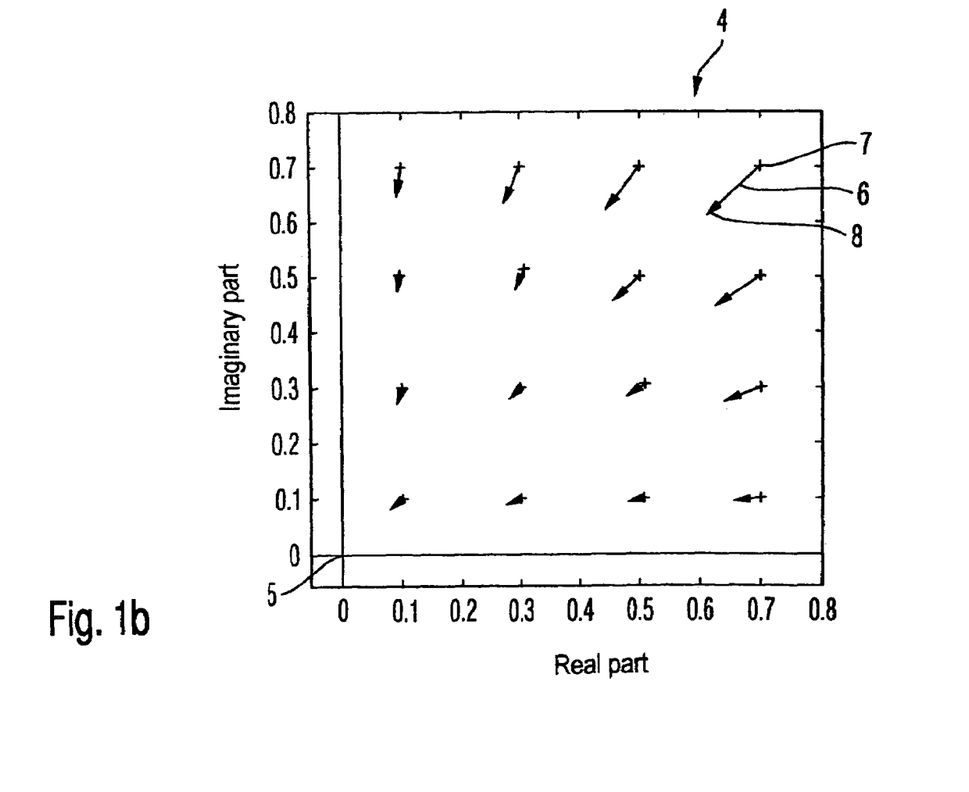

By way of explanation, the altered position of the decision points based on the amplitude characteristic curve 1 for the first quadrant 4 of a constellation diagram in the example of a 64 QAM (Quadrature Amplitude Modulation) is shown in FIG. 1b. The possible samples of the ideal baseband signal at decision points in time in a complex baseband (constellation diagram) are shown in FIG. 1b as crosses. Corresponding to the course of the amplitude characteristic curve 1, the samples of the real baseband signal respectively shift to the decision points in time in the direction of the origin 5 of the coordinate axes (real part and imaginary part) of the diagram. The dimension of the shift is indicated thereby by the length of an error vector 6 for each sample of the constellation diagram, which connects respectively a sample 7 of the ideal baseband signal at decision points in time to a sample 8 of the real baseband signal.

In FIG. 1b, this is shown by way of example with reference numbers only for the value furthest away from the origin 5. Corresponding to the characteristic curve course of FIG. 1a, not directly proportional deviations from the corresponding ideal value are generated with increasing power, i.e. increasing distance of the samples from the origin 5. In FIG. 1b, this can be deduced from the correspondingly greater length of the error vectors. For a pure amplitude distortion, all the error vectors lie on a straight line through the origin 5.

Figure 2A:
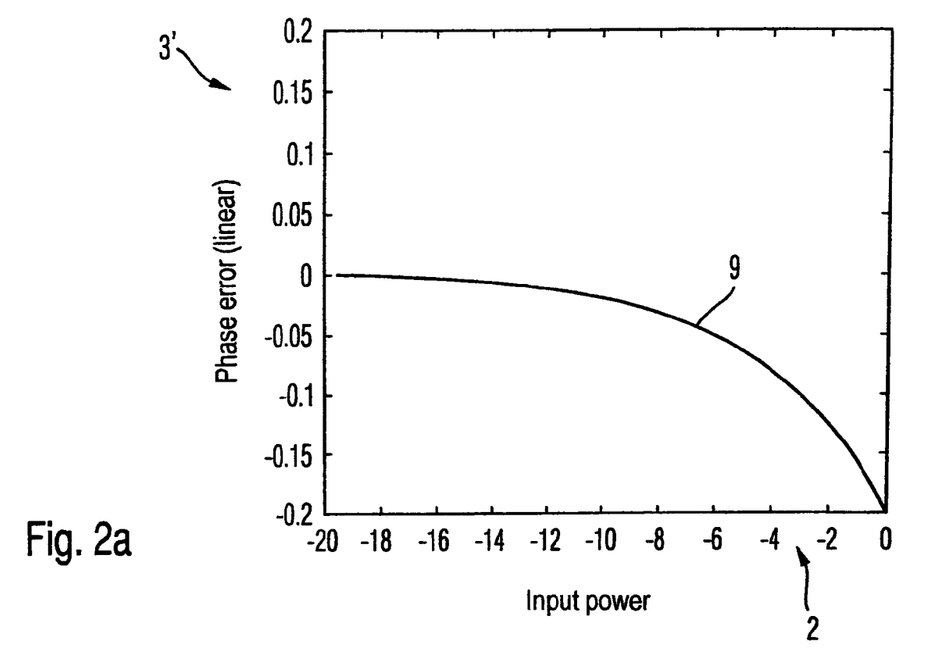
Figure 2B:
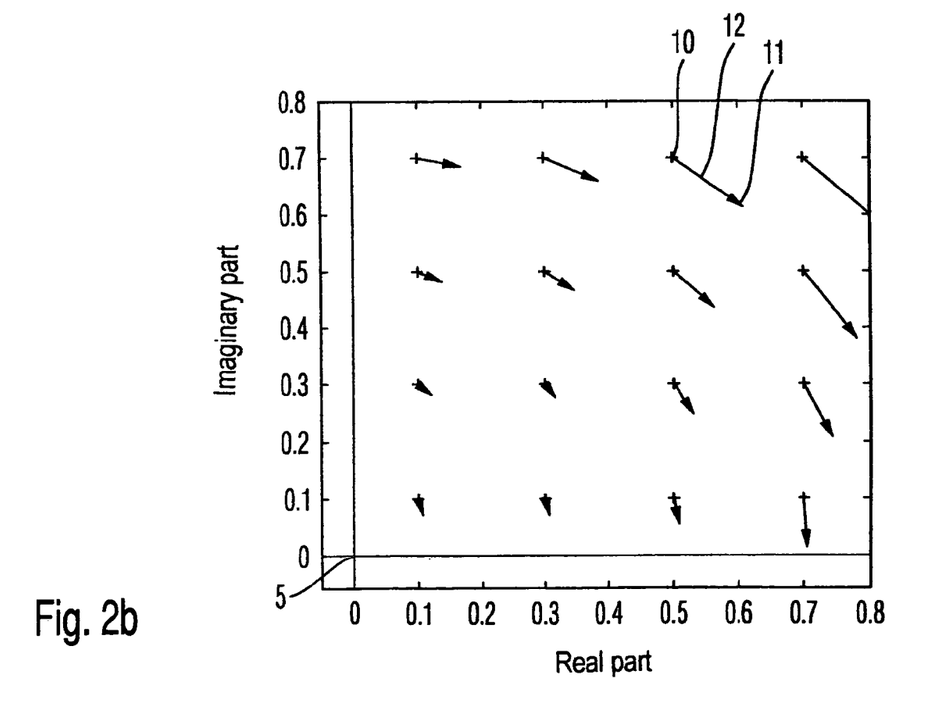

An analogue representation of a phase characteristic curve 9 of the transmitter amplifier is shown in FIG. 2a, the abscissa 2 showing in turn the input power in a logarithmic representation. However, on a likewise illustrated logarithmic ordinate 3', the deviation of the phase from the ideal value is now shown. The associated representation in a constellation diagram is shown in FIG. 2b. The possible samples of the ideal baseband signal at the decision points in time are shown in turn as crosses and combined with the samples of the real baseband signal via respectively one error vector, in turn the length of the error vector corresponding to the magnitude of the deviation. This is shown by way of example for the ideal value 10 at a decision point in time, for the corresponding real value 11 at the decision point in time and for the error vector 12 with reference numbers. A deviation of the phase is shown in the constellation diagram as a rotation about the origin 5. As is generated from the phase characteristic curve 9, the angle of the respective error vector 12 is thereby disproportionately greater, the further the sample in the constellation diagram is distant from the origin 5.

Figure 3:
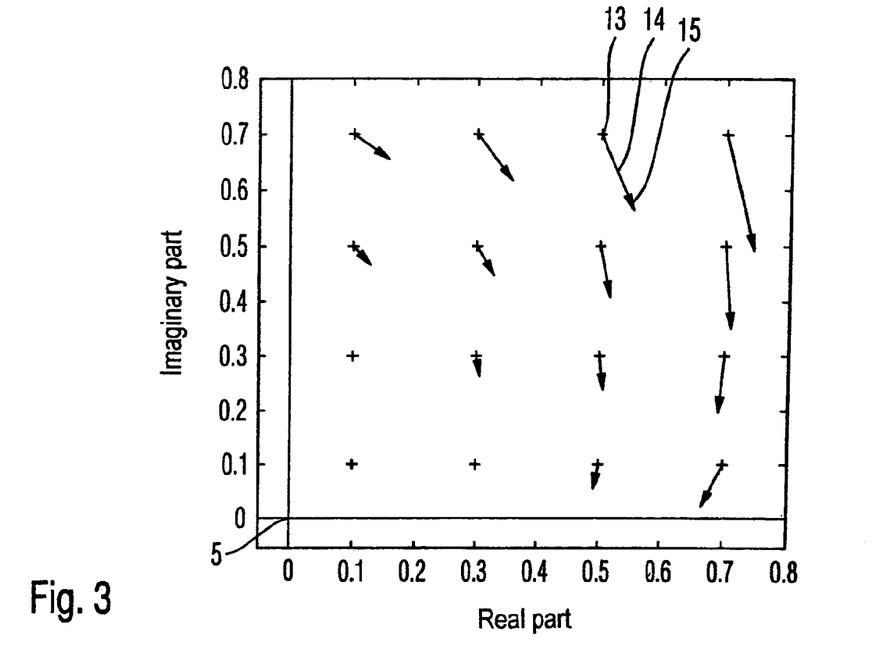

A real amplifier in general has both non-linear distortions of the phase and also of the power or the amplitude. There is produced hence the representation of a constellation diagram shown in FIG. 3. As in the preceding examples, the representation is restricted to the first quadrant for greater clarity. The position of the samples 15 of the real baseband signal at the decision points in time is now produced from the position of the samples of the ideal baseband signal, which are shown in turn by crosses in FIG. 3, and from the added error vectors of FIG. 1b and FIG. 2b, which are added to form a total error vector 14. FIG. 3 shows this by way of example again only for one point of the constellation diagram.

Figure 4:
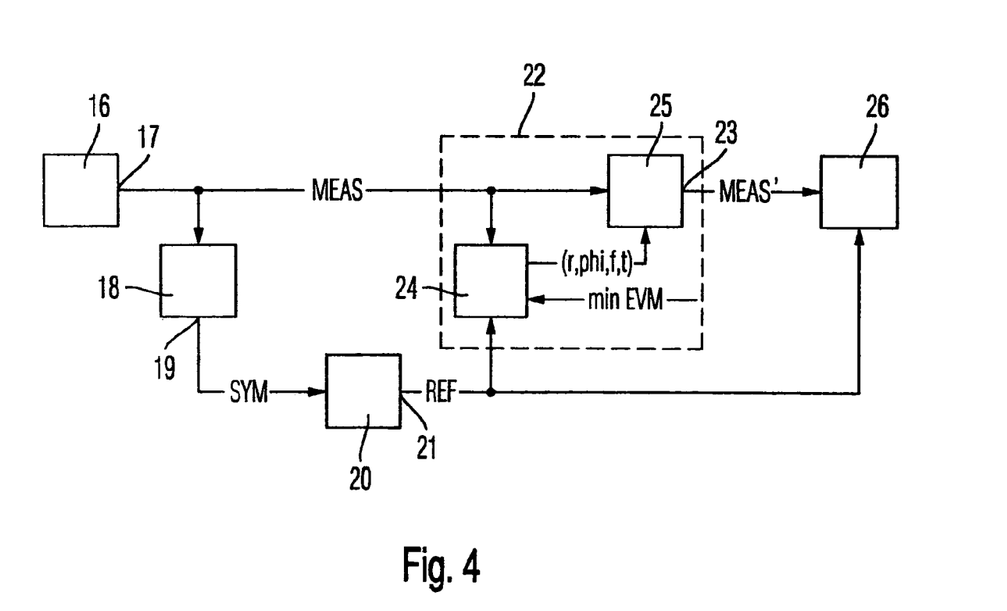

A first embodiment of a measuring device according to the invention is shown in FIG. 4. In the measuring device, a high frequency signal, which is transmitted by a high frequency transmitter and modulated with a modulation signal, is received by a receiving unit 16. The received high frequency signal is processed by the receiving unit 16 so that, at an output 17 of the receiving unit 16, a complex value, real baseband signal MEAS, which is scanned from the received high frequency signal after downward mixing, is output. This real baseband signal MEAS is supplied to a demodulation device 18. The demodulation device 18 generates samples by digital sampling of the real baseband signal MEAS and demodulates these samples of the real baseband signal MEAS. The symbols obtained by the demodulation of the samples of the real baseband signal MEAS are output as a modulation symbol sequence SYM at an output 19 of the demodulation device 18. For demodulation, possibly known information of the signal, such as for example midambles or pn sequences (Pseudo Noise) can be taken into account.

The modulation symbol sequence SYM is, apart from slight interferences, for example by noise, identical to the modulation symbol sequence, on the basis of which the signal to be transmitted was generated in the transmitting device. Because of generating the modulation symbol sequence SYM from the received high frequency signal, the complete information of the original, ideal signal is present in the measuring device 15. The modulation symbol sequence SYM is relayed to a digital filter 20. In its function, the digital filter 20 corresponds to an ideal modulator, at the output 21 of which an ideal baseband signal REF is output, which is used during further evaluation as reference signal.

Both the ideal baseband signal REF and the real baseband signal MEAS are supplied to a correction device 22. The samples of the real baseband signal MEAS and the corresponding samples of the ideal baseband signal REF, which forms the reference signal, are compared with each other by the correction device 22 and, as a result of the comparison, a corrected, real baseband signal MEAS' is output at an output 23 of the correction device 22. For comparison of the real baseband signal MEAS with the ideal baseband signal REF, the deviations are determined from respectively corresponding samples of the real baseband signal MEAS and of the ideal baseband signal REF. The sum of the squares of these deviations is minimized, in that a set of parameters (r, phi, f, t, . . . ) is determined for the real baseband signal MEAS, for which set of parameters the sum of the quadratic deviations and hence the magnitude of the error vectors (EVM, Error Vector Magnitude) is minimal.

The first step, in which the set of parameters (r, phi, f, t) is determined, is effected in a minimization element 24. The set of parameters (r, phi, f, t) contains e.g. correction values for the input power r, the phase phi, the frequency f and the time t, so that linear distortions of the real baseband signal MEAS, as arise for example due to different base frequencies of the transmitter and of the receiver or due to a time shift because of the processing of the signals, are minimized. Further conceivable parameters can likewise be provided in order to take into account a carrier disruption (IQ offset), an unequal amplification between the I and Q channel in the transmitter (IQ imbalance) or a level changing over time, for example due to heating of the end stages (amplitude droop).

If the set of parameters is determined, then this is supplied to a correction element 25 which implements a corresponding correction of the real baseband signal MEAS by means of the set of parameters (r, phi, f, t) and outputs a corrected, real baseband signal MEAS' at its output 23. By means of the correction in the correction device 22, a minimization of the deviations of the samples of the real baseband signal MEAS from the samples of the ideal baseband signal REF is implemented, this correction relating only to linear components of the distortion so that, in the output, corrected, real baseband signal MEAS', the non-linear distortions required for determining and representing the characteristic curve are still contained.

In order to determine and output an amplitude or phase characteristic curve, the corrected, real baseband signal MEAS' and also the ideal baseband signal REF is supplied to an evaluation device 26. The evaluation device 26 has a display device, not shown in detail, for illustrating the determined characteristic curves. The determination of the characteristic curve course itself is explained subsequently in detail.

Figure 5A:
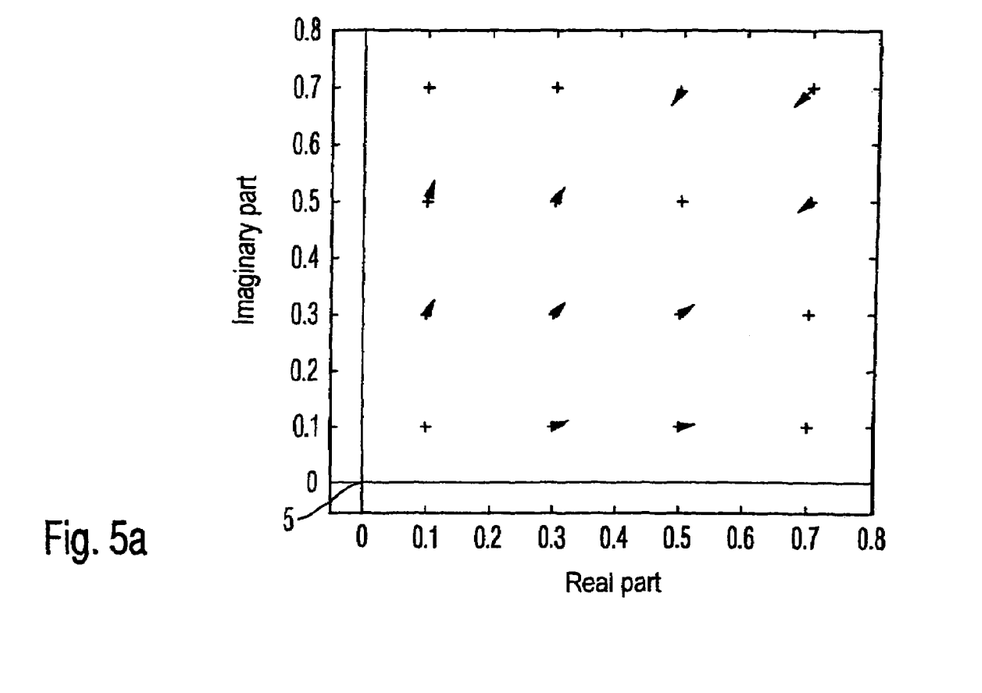
Figure 5B:
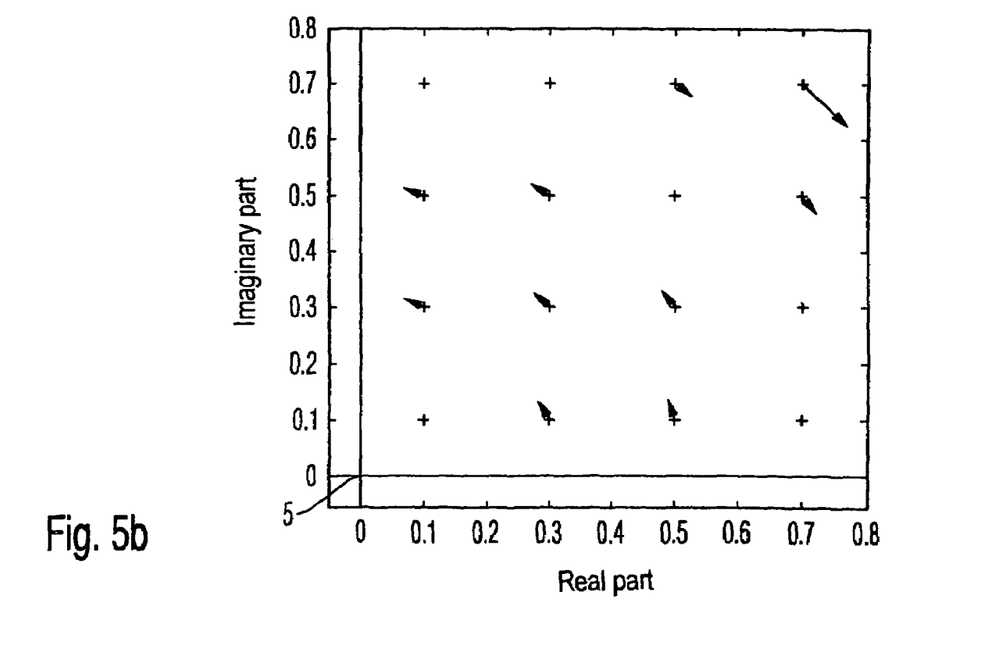

On the basis of the minimization of the deviations of the samples of the real baseband signal MEAS from the ideal baseband signal REF in the minimization element 24, the result is shifting of the samples of the corrected, real baseband signal MEAS at the decision points in time in the constellation diagrams, as is shown in FIG. 5a, 5b for the amplitude (FIG. 5a) or the phase (FIG. 5b). As was already explained in the description of FIG. 1b or 2b, the deviations for samples, which are far removed from the origin 5, are disproportionately greater than for those values that are situated close to the origin 5. If the deviations, as is accepted initially, are taken into account equally by the minimization element 24 during determination of the set of parameters (r, phi, f, t), this leads to a reduction in error for those points in the constellation diagram which are far removed from the origin 5, but in reverse to an increase in error for those values which are situated closer to the origin 5 and therefore only have a small deviation or no deviation before the correction. In FIGS. 5a, b, the samples of the ideal baseband signal REF at decision points in time are again shown as crosses which are connected by error vectors to the corresponding samples of the corrected, real baseband signal MEAS. For the representation of the amplitude distortions in FIG. 5a, the error vectors again lie on straight lines which extend through the origin 5 whereas, in the representation of the phase distortion in FIG. 5b, the error vectors respectively connect two points to each other, which points are disposed on a circle around the origin 5.

Figure 6:
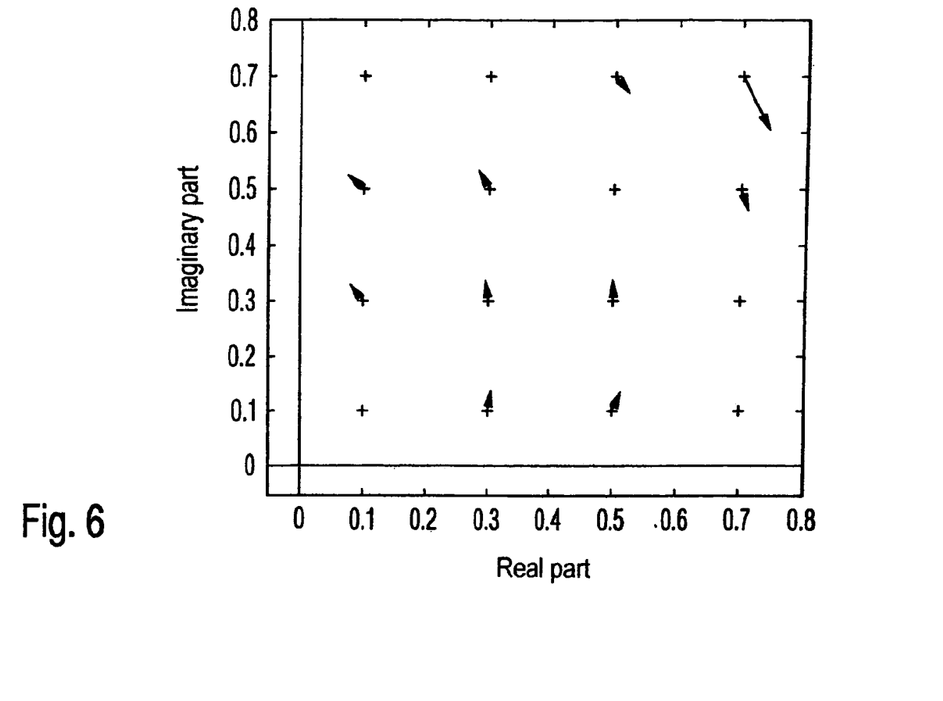

Analogously to the considerations relating to FIG. 3, a constellation diagram for the corrected, ideal baseband signal MEAS, as is shown in FIG. 6, is generated for the sum of the amplitude and phase distortions.

It is explained subsequently how an approximation of the course of the amplitude or phase characteristic curve is effected from the samples of the corrected, real baseband signal MEAS' and also of the ideal baseband signal REF. In the evaluation device 26, initially the power or level range to be observed for determining the characteristic curve is subdivided for this purpose into a plurality of intervals 27, the intervals 27 dividing the observed level range as portions of equal width b. Adjacent intervals 27 therefore abut directly on each other, as is shown for example for the n intervals 27.1 to 27.n in FIG. 7. The intervals 27 divide the level range in question uniformly, which range extends from $p_1$ to $p_2$.

Figure 7:
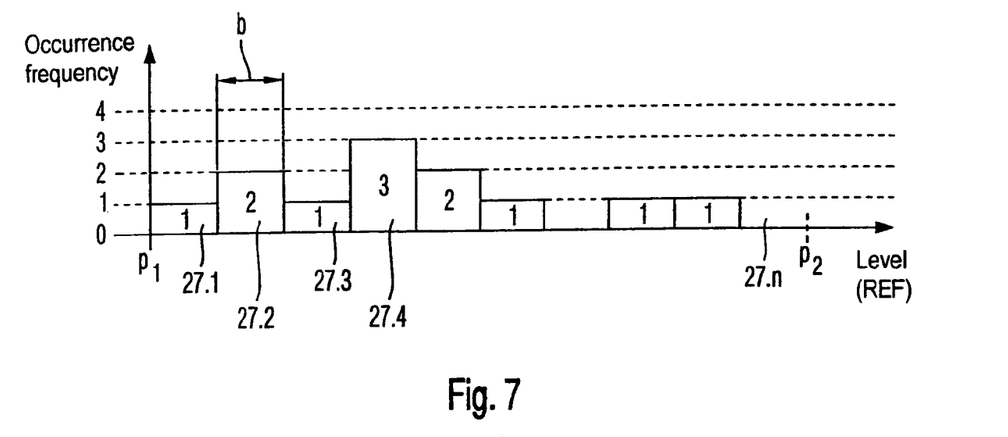

The samples of the corrected real baseband signal MEAS' are now assigned respectively to an interval 27, the level of the sample of the ideal baseband signal REF corresponding to the sample of the corrected, real baseband signal MEAS' being used in order to assign the samples to a specific interval 27.1 to 27.n respectively. For further evaluation, a first field (array) is applied to the evaluation device 26, in which field each element represents a specific interval 27.1 to 27.n. In this first field (array), the number of samples falling within a specific interval 27.1 to 27.n is determined, in that the relevant value of the field (array) element is incremented with each sample that falls within the interval. A first field (array) formed in such a manner corresponds to a histogram, as is shown in FIG. 7, and in the case of which the height of the bar indicates the number of samples contained in the respective interval 27.1 to 27.n.

The levels of the samples of the ideal baseband signal REF, which are contained in the individual intervals 27.1 to 27.n are added and stored as first interval sum respectively in an element of a second field (array). The magnitudes of the complex samples of the real baseband signal MEAS, which fall within a specific interval 27.1 to 27.n, are added up and the sum for each interval respectively is stored as second interval sum in an element of a third field (array). Likewise, the phase errors between the samples of the corrected, real baseband signal MEAS' and the samples of the ideal baseband signal REF are added up and stored in respectively one element of a fourth field (array).

The content of each interval 27.1 to 27.n is hence reproduced by the number of samples falling within the intervals 27.1 to 27.n, which number is stored in one element in the first field (array), the added levels of the samples of the ideal baseband signal REF of the intervals 27.1 to 27.n of an element in the second field (array) and also the added levels of the samples of the corrected, real baseband signal MEAS' of each interval in respectively one element of the third field (array) or the added phase errors of each interval in an element of fourth field (array).

Instead of parallel storage of the sums of the level or of the phase errors in the elements of the third and fourth field (array), restriction to one field (array) is conceivable, which contains either the added levels or the added phase errors dependent upon the characteristic curve to be determined.

Figure 8:
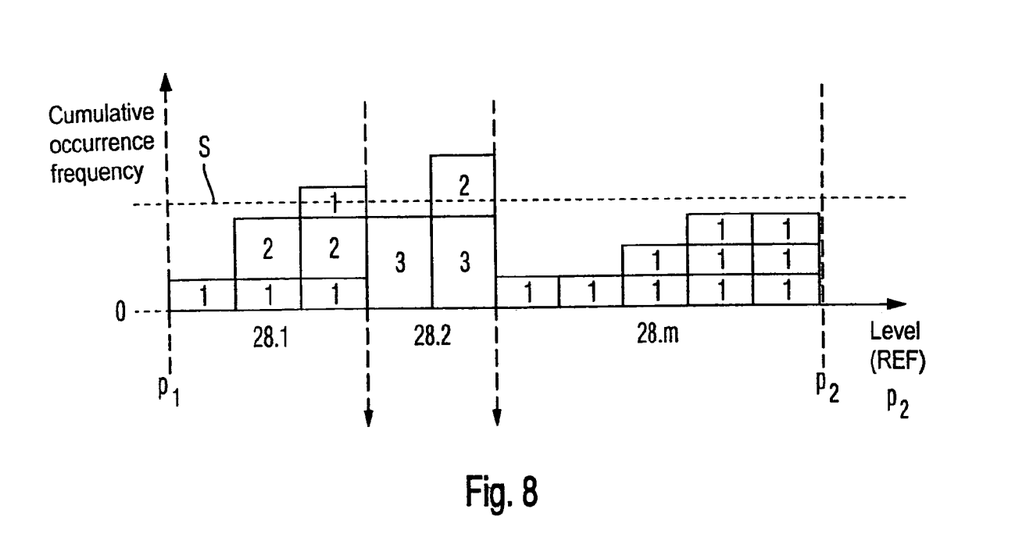

The individual intervals 27 are now combined in groups 28, a support point for the characteristic curve to be determined later being formed from each group 28. The combination in groups 28 is shown in FIG. 8. For this purpose, a number of groups is determined in advance, preferably independently of the measurement that has been implemented. The total number of samples available from the measurement is known. The number of measuring values that can be assigned to one group 28 is determined therefrom. The values of the individual elements of the first field (array), which belong to adjacent intervals 27, are now added up until the sum resulting therefrom approximately achieves the prescribed number of samples. In the simplest case, this can be achieved such that the addition of the values of the elements of the first field (array) is interrupted, when a limit value S, which corresponds to the number of samples for one group e.g. 28.1, is exceeded. In the example, the intervals 27.1 to 27.3 are thus combined to form a first group 28.1.

Beginning with the next interval 27.4 or the assigned element of the first array, the addition for the next group, in the example 28.2, is begun. By means of this addition, which is implemented for the values of the corresponding elements of the second, third and fourth field (array), the total number of samples in approximately equal parts are distributed to the groups 28.1 to 28.m. Starting from the histogram representation of FIG. 7, the cumulative frequencies shown in FIG. 8 are produced for the groups 28.1 to 28.m.

By adding the values of the individual elements of the fields (arrays), there is present for each of the groups 28, which are also described as clusters, only respectively information with respect to the number of values, the sum of the levels of the samples of the ideal baseband signal REF, the sum of the levels of the samples of the corrected, real baseband signal MEAS' and also the sum of the phase errors. If the characteristic curve of an amplifier is to be determined, then now the two sums of the levels and the sums of the phase errors for each group 28.1 to 28.m are divided by the number of values of these groups 28.1 to 28.m in order to determine for each group respectively an average value for the level of the ideal baseband signal REF, the level of the corrected, real baseband signal MEAS' and the phase error. In addition to the simplest case of arithmetic averaging, other procedures are also conceivable in this respect in which a weighting is effected.

In order to represent an amplitude characteristic curve in an AM/AM diagram, the Y axis value is determined for each group 28.1 to 28.m, the quotient being formed from the average value of the levels of the samples of the corrected, real baseband signal MEAS' and from the average value of the levels of the samples of the ideal baseband signal REF for each group 28.1 to 28.m and this quotient being made into a logarithm. The logarithmic quotient generates for each group 28.1 to 28.m a Y axis value in the AM/AM diagram.

In the case of a representation of a phase characteristic curve in an AM/PM diagram, the Y axis value is the average value of the phase errors for each group 28.1 to 28.m.

Figure 9:
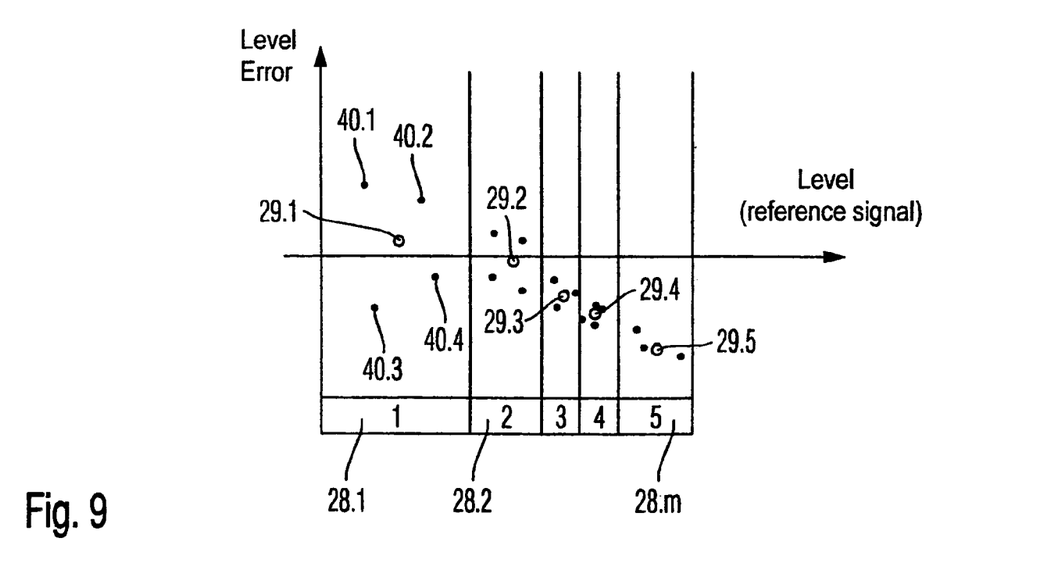

Together with the respective average value for the level of the ideal baseband signal REF of the groups 28.1 to 28.m, representation value pairs, which are shown as support points 29.1 to 29.m in FIG. 9, are produced.

The support point 29.1 shown in FIG. 9 contains the information about the samples 40.1 to 40.4 of the corrected, real baseband signal MEAS', which values are assigned to the group 28.1. Correspondingly, the information of the samples of the individual groups 28.2 to 28.m is combined in the support points 29.2 to 29.m. It should thereby be observed that the level of the reference signal is used as the value for the abscissa. As a result, the determined support points 29.1 to 29.m can be used in a simple manner for approximating the course of the characteristic curve.

Figure 10A:
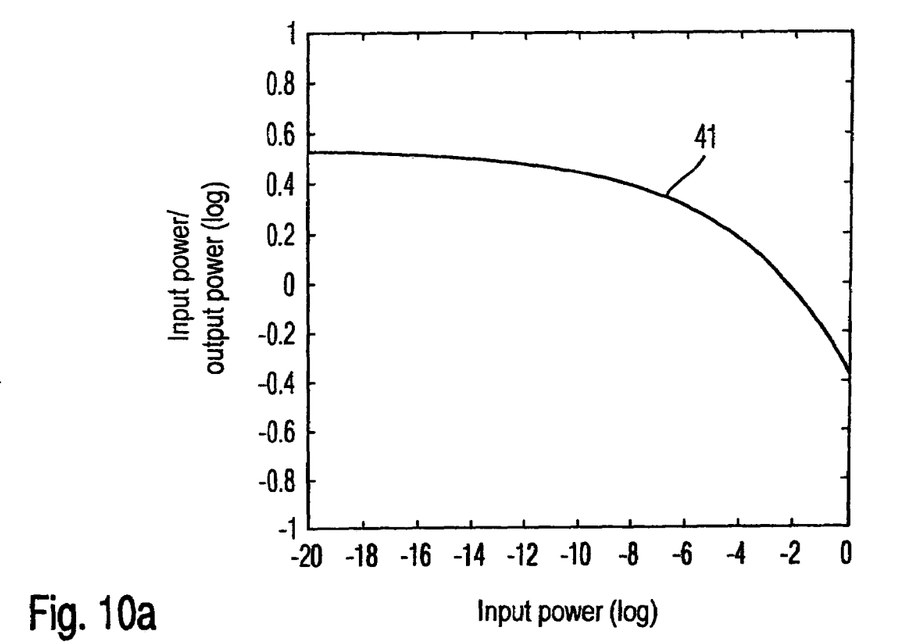
Figure 10B:
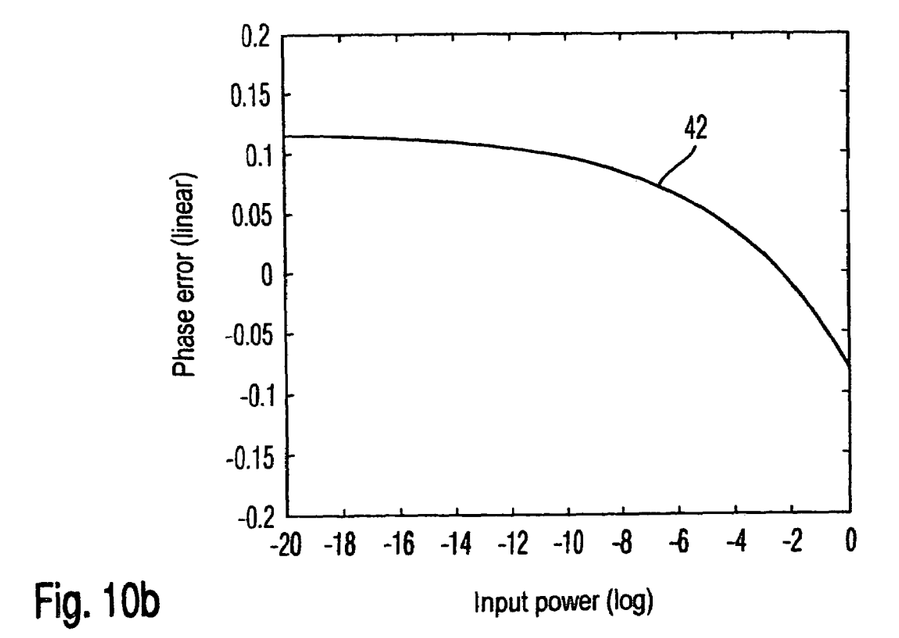

In order to determine the course of the characteristic curve, known methods are used for approximation of measuring values. A characteristic curve, which is linear in portions in the region of the support points 29.1 to 29.m, can be mentioned as the simplest example. The approximation by spline interpolation or a polynomial of the $n^{th}$ order can likewise be applied. In FIG. 10a and 10b, one amplitude characteristic curve 41 and one phase characteristic curve 42 are shown respectively by way of example.

Figure 11:
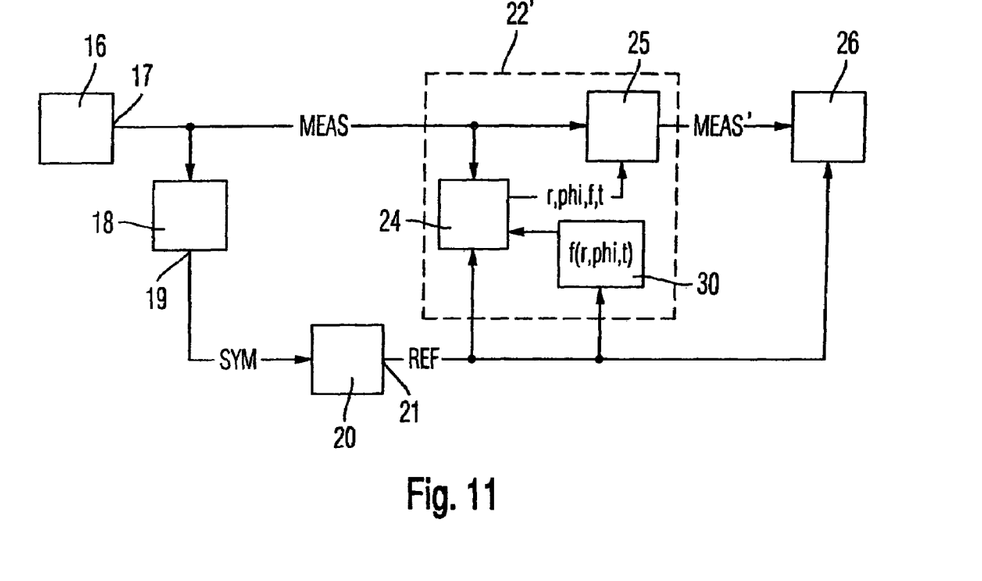

According to the further embodiment of the measuring device according to the invention shown in FIG. 11, a correction device 22' is provided which has an evaluation device 30 in addition to the minimization element 24 and the correction element 25. In order to avoid repetition, a description of identical components known from FIG. 4 is dispensed with. The ideal baseband signal REF is supplied on the input side to the evaluation device 30. By means of the evaluation device 30, a weighting of the samples can be effected during calculation of the set of parameters (r, phi, f, t) by the minimization element 24. It is therefore possible for example to take those samples with high levels less into account than those with low levels. By means of such a weighting, it is achieved that an increase in the error of the samples close to the origin is reduced in comparison to taking into account all available samples in a uniform manner.

In the simplest case, due to such an evaluation function f (r, phi, f, t) of the evaluation device 30, e.g. all those samples which exceed a specific threshold of the level, remain neglected so that, for the corrected, real baseband signal MEAS', the resultant error of the samples close to the origin 5 is particularly small. In order to suppress too great an influence of the noise with a very low level, for example only the values that lie within one level interval can be taken into account. The evaluation function f (r, phi, f, t) that is used is preferably adapted to the distortion model. It can also be particularly advantageous to select points in time or intervals in time, which are determined by means of the evaluation function, in data sets, for example the symbol decision points, in order to suppress as a result interferences, such as occur e.g. in the symbol transitions close to the complex "0".

Figure 12:
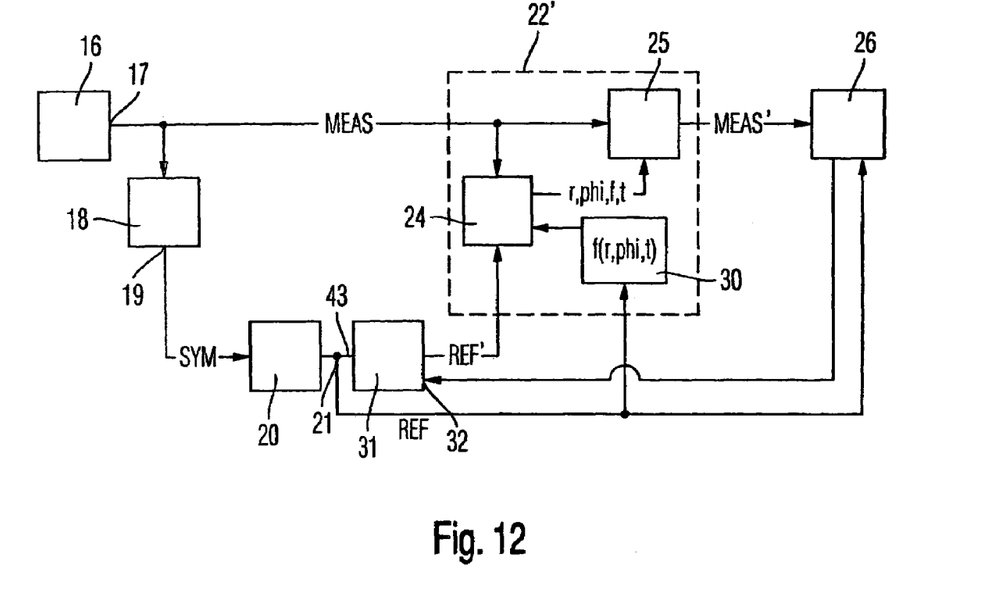

In FIG. 12, a further embodiment is shown in which a non-linear distortion element 31 is provided in addition. The non-linear distortion element 31 is disposed in the signal path of the ideal baseband signal REF between the digital filter 20 and the correction device 22'. In addition to the ideal baseband signal REF, which is supplied to an input 43, in addition information about the already determined course of the characteristic curve at a second input 32 is transmitted to the non-linear distortion element 31. As a result, a pre-distortion of the ideal baseband signal REF transmitted to the correction device 22' can be effected with the result of a first evaluation, which signal is then supplied to the correction device 22' so that the minimization of the deviations on the basis of the real baseband signal MEAS and a pre-distorted ideal baseband signal REF' is effected. This process can be repeated in a plurality of steps. For the first evaluation, the distortion element 31 relays the ideal baseband signal REF undistorted to the minimization element 24.

In this iterative process, for example the real baseband signal MEAS and the ideal baseband signal REF can be stored in order to improve the model for the distortions. As the knowledge of the model for the distortions becomes more precise, an adaptation of the evaluation function can be effected in addition in the evaluation device 30. The improved knowledge of the characteristic curve can also be used for a pre-distortion of an ideal baseband signal REF, which is generated from the demodulation of an unknown, real baseband signal MEAS, for example therefore in the case of a measurement during operation of the transmitting amplifier.

Figures 13A, 13B:
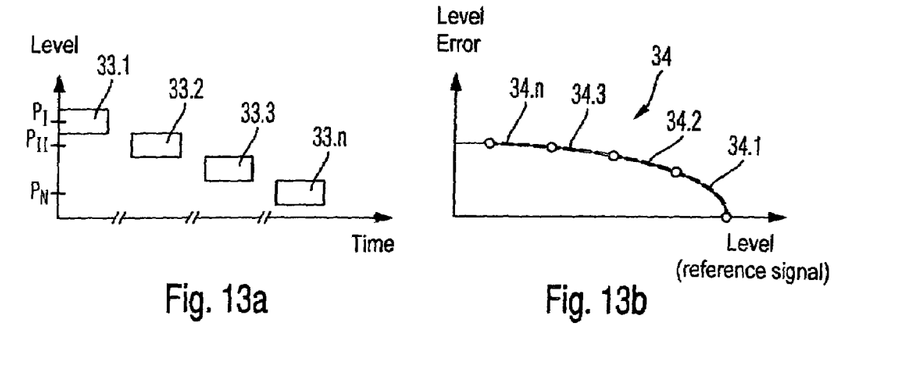

In FIG. 13a, a plurality of successive measurements 33.1 to 33.n is shown. For each of the individual measurements 33.1 to 33.n, the amplifier to be measured is swung into another level range $P_I$ to $P_N$. The evaluation by forming groups and representation value pairs assigned respectively to the individual groups is effected analogously to the already described method for each of the level ranges $P_I$ to $P_N$. For each of the individual measurements 33.1 to 33.n, a specific portion 34.1 to 34.n of a characteristic curve 34 is hence produced, which portion can then be combined, as is shown in FIG. 13b.

Figure 14:
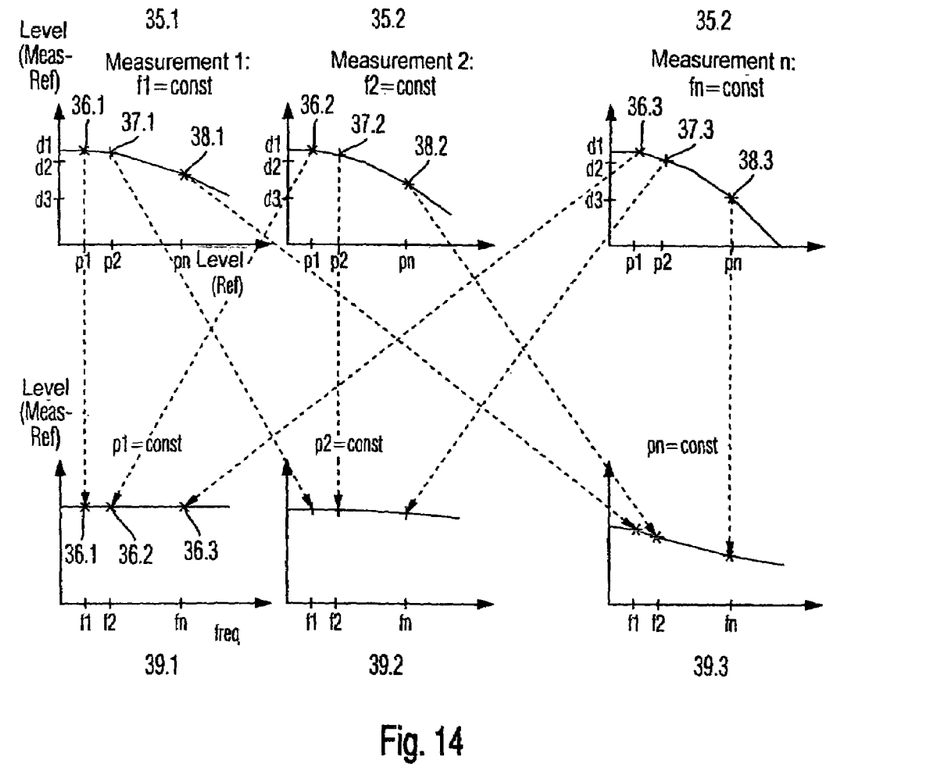

A further possibility is shown in FIG. 14 of obtaining additional information relating to the course of the characteristic curves by means of a plurality of successive measurements. In the upper half of FIG. 4, three successive measurements 35.1, 35.2 and 35.3 are shown, another frequency f1, f2 or f3, which is however constant for the individual measurement, being set for each of the measurements 35.1, 35.2 and 35.3. The evaluation produces for each of the three measurements three representation value pairs 36.1, 37.1, 38.1 or 36.2, 37.2 etc. The respectively first of the three representation value pairs, 36.1, 36.2 and 36.3 is thereby formed for a first level value p1 of the ideal baseband signal. Since the three measurements were implemented however for different frequencies f1, f2 or f3, these three representation value pairs 36.1, 36.2 and 36.3 can also be plotted in a diagram, which shows the frequency f as abscissa. Hence, as a characteristic curve, the level deviation can also be represented as a function of the frequency.

Such a representation is also possible for the remaining representation value pairs 37.i and 38.i so that, in the embodiment shown for three different, but constant levels p1, p2 or p3, the diagrams designated with 39.1, 39.2 or 39.3 are produced. Instead of the representation in different diagrams, the x axis of which shows both the level and frequency, the representation in a three-dimensional diagram is also conceivable.

Figure 15:
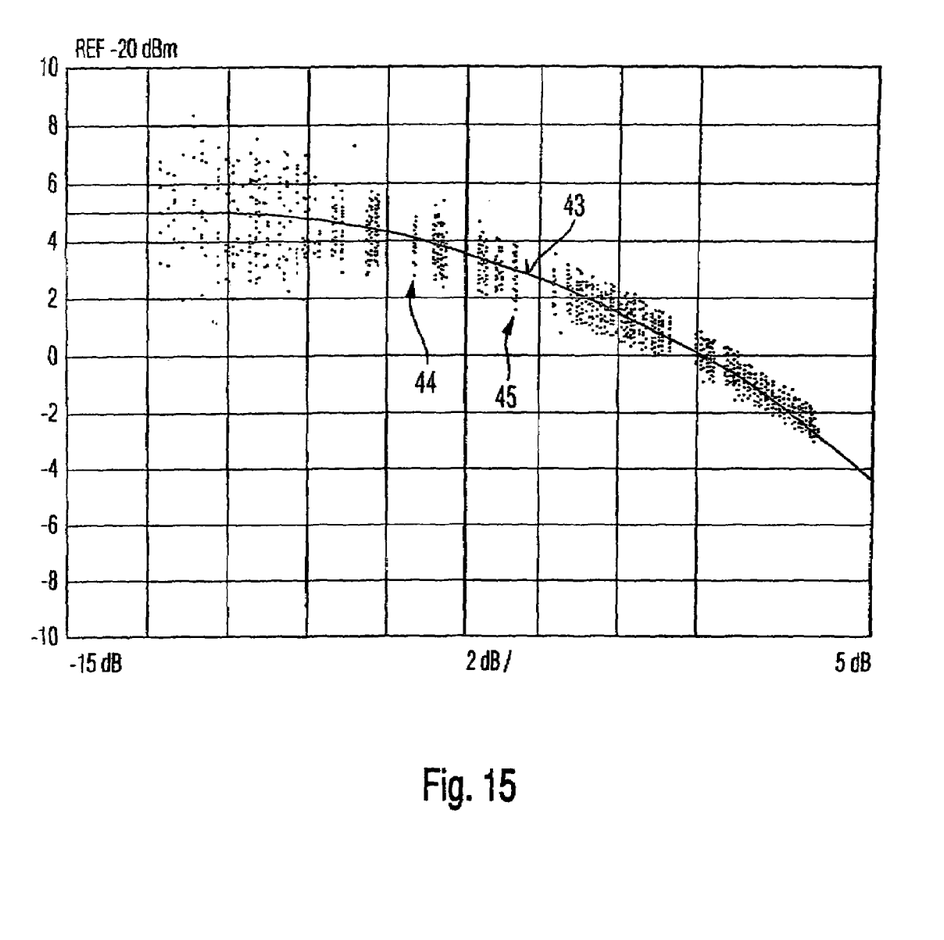

In FIG. 15, an example of a course of a phase characteristic curve 43, determined from a plurality of groups, is shown. The characteristic curve is produced as a portion-wise straight approximation to the support points and plotted via a logarithmic abscissa.

In addition to the phase characteristic curve 43, the samples are shown which underlie the determination of the phase characteristic curve. The arrangement of the samples, in which a plurality of samples respectively lies on one vertical line, is based on the assignment of the samples to a power value, which is determined by the ideal baseband signal REF. With the reference numbers 44 and 45, those samples belonging to two power values of the ideal baseband signal REF are described by way of example.

What is claimed is:

1. A method for determining a characteristic curve of a high frequency unit, which outputs a high frequency signal modulated with a modulation signal, said method comprising the following steps:
   receiving the high frequency signal output by the high frequency unit and generating samples of a complex value, real baseband signal;
   generating a modulation symbol sequence by demodulation of the sampled baseband signal;
   simulating an ideal baseband signal from The modulation symbol sequence as a reference signal;
   generating a corrected, real baseband signal by correcting the real baseband signal; and
   evaluating the deviations of samples of the corrected, real baseband signal from samples of the ideal baseband signal.

2. The method according to claim 1, wherein the ideal baseband signal is simulated by means of a filter from The modulation symbol sequence determined by the demodulation of the real baseband signal.

3. The method according to claim 1, wherein a set of parameters is determined in order to correct the real baseband signal, for which set of parameters the deviation of the samples of the corrected, real baseband signal from the samples of the ideal baseband signal is minimal.

4. The method according to claim 3, wherein an average quadratic error is minimized in order to determine the minimal deviation of the samples of the corrected, real baseband signal from the samples of the ideal baseband signal.

5. The method according to claim 3, wherein only specific, selected samples of the real baseband signal and of the ideal baseband signal are used in order to determine the set of parameters.

6. The method according to claim 5, wherein those samples of the real baseband signal and of the ideal baseband signal, which lie on symbol decision points in time, are used as specific, selected samples.

7. The method according to claim 3, wherein the ideal baseband signal is weighted by means of an evaluation function in order to determine the set of parameters.

8. The method according to claim 1, wherein a plurality of groups is formed, a plurality of samples being combined in each group.

9. The method according to claim 8, wherein the samples of a plurality of intervals are combined in order to form the groups, the intervals dividing an amplitude range or level range to be evaluated as portions of the same width and each sample being assigned to a specific interval.

10. The method according to claim 9, wherein in each group, the samples of intervals are combined each group contains approximately the same number of samples.

11. The method according to claim 9, wherein for each interval, the ideal levels or ideal amplitudes determined from the ideal baseband signal are added to form a first interval sum and, for each group, the first interval sums of those intervals, which are combined to form one group, are added up.

12. The method according to claim 9, wherein for each interval, the levels of the samples of the corrected, real baseband signal of the samples combined within the interval are added to form a second interval sum and/or, for each interval, the phase errors of the samples of the corrected, real baseband signal of the samples combined within the interval are added in a third interval sum, said phase errors being determined by comparison with the samples of the ideal baseband signal and, for each group, the second and/or third interval sums of those intervals, which are combined to form a group, are added up respectively.

13. The method according to claim 9, wherein the determination of the interval limits is effected independently of the real baseband signal.

14. The method according to claim 9, wherein a representation value pair is determined for each group.

15. The method according to claim 14, wherein a course of a characteristic curve is approximated with the representation value pairs as support points.

16. The method according to claim 15, wherein the course of the characteristic curve is approximated to the support points by means of a polygonal curve course.

17. The method according to claim 15, wherein the course of the characteristic curve is approximated to the support points by means of a polynomial.

18. The method according to claim 15, wherein the course of the characteristic curve is approximated to the support points by means of a spline interpolation.

19. The method according to claim 14, wherein each representation value pair, comprising a first average value of the ideal levels or of the ideal amplitude and a second average value for the level of the samples of the corrected, real baseband signal or a second average value for the deviation of the phase of the samples of the corrected real baseband signal, is formed from the samples of the ideal baseband signal of the respective group.

20. The method according to claim 14, wherein a measurement is implemented respectively for various level settings of the high frequency unit and the representation value pairs of the various measurements are used in order to form a characteristic curve.

21. The method according to claim 1, wherein a plurality of characteristic curves is determined from respectively one measurement and an average characteristic curve is formed from the plurality of characteristic curves by averaging.

22. A measuring device for determining a characteristic curve of a high frequency unit which outputs a high frequency signal modulated with a modulation signal, said measuring device comprising:
a receiving unit for receiving the high frequency signal output by the high frequency unit and for generating samples of a complex value, real baseband signal,
a demodulation device for generating a modulation symbol sequence of the sampled real baseband signal,
a digital filter for simulating an ideal baseband signal from the modulation symbol sequence,
a correction device for correcting the samples of the real baseband signal dependent upon the samples of the ideal baseband signal and for outputting a corrected, real baseband signal, and
an evaluation device for evaluating the deviations of the samples of the corrected, real baseband signal from the samples of the ideal baseband signal.

23. The measuring device according to claim 22, wherein the correction device comprises a minimization element for determining a set of parameters, for which the deviations of samples, with the set of parameters, of the corrected, real baseband signal from the samples of the ideal baseband signal are minimal, and a correction element for outputting a correct, real baseband signal with the determined set of parameters.

24. The measuring device according to claim 22, wherein an evaluation device for weighting the ideal baseband signal by means of an evaluation function for the correction of the samples is provided.

25. The method according to claim 1, wherein the step of generating the corrected, real baseband signal includes generating a real complex value baseband signal as the corrected, real baseband signal.

26. The measuring device according to claim 22, wherein the corrected, real baseband signal is a real complex value baseband signal.

* * * * *